United States Patent
Rekhi et al.

(10) Patent No.: US 7,254,792 B1
(45) Date of Patent: Aug. 7, 2007

(54) ACCOUNTING FOR THE EFFECTS OF DUMMY METAL PATTERNS IN INTEGRATED CIRCUITS

(75) Inventors: Sanjay Rekhi, Fremont, CA (US); Michael La Bouff, Los Gatos, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 148 days.

(21) Appl. No.: 10/876,396

(22) Filed: Jun. 25, 2004

Related U.S. Application Data (60) Provisional application No. 60/483,464, filed on Jun. 27, 2003.

(51) Int. Cl.
*G06F 17/50* (2006.01)

(52) U.S. Cl. .............................. 716/5; 716/4

(58) Field of Classification Search ............. 716/4, 716/2, 5, 10, 11, 21; 702/65; 438/619
See application file for complete search history.

(56) References Cited

U.S. PATENT DOCUMENTS

| | | | |
|---|---|---|---|
| 5,790,417 A * | 8/1998 | Chao et al. ............... 716/21 |
| 6,037,249 A * | 3/2000 | Chiang et al. ............. 438/619 |
| 6,243,653 B1 * | 6/2001 | Findley ..................... 702/65 |
| 6,381,730 B1 * | 4/2002 | Chang et al. .............. 716/5 |
| 6,678,879 B1 * | 1/2004 | Hawse et al. ............. 716/21 |
| 6,816,999 B2 * | 11/2004 | Lee ............................. 716/5 |
| 6,854,100 B1 * | 2/2005 | Chuang et al. ............ 716/5 |
| 2002/0116686 A1 * | 8/2002 | Shin et al. .................. 716/2 |
| 2002/0144224 A1 * | 10/2002 | Frerichs et al. ............ 716/4 |
| 2003/0229875 A1 * | 12/2003 | Smith et al. ............... 716/10 |
| 2003/0299875 * | 12/2003 | Smith et al. ............... 716/10 |
| 2004/0158805 A1 * | 8/2004 | Kanamoto et al. ........ 716/11 |

* cited by examiner

*Primary Examiner*—Leigh M. Garbowski
(74) *Attorney, Agent, or Firm*—Okamoto & Benedicto LLP (57) ABSTRACT

In one embodiment, a level in a process technology for an integrated circuit that has dummy metal patterns is represented as a level in a process model. The level of the process model may comprise a high-k dielectric to represent the dummy metal patterns. In the level of the process model, each metal line may be surrounded by a normal dielectric. If the process technology has voids or pockets of air in between the metal lines, then each void or air pocket may be placed in a normal dielectric in the process model. Among other advantages, this allows the process model to take into account the effects of the dummy metal patterns.

13 Claims, 6 Drawing Sheets

ACCOUNTING FOR THE EFFECTS OF DUMMY METAL PATTERNS IN INTEGRATED CIRCUITS

CROSS-REFERENCE TO RELATED APPLICATION

This application claims the benefit of U.S. Provisional Application No. 60/483,464, filed on Jun. 27, 2003, entitled "METHOD TO ACCOUNT FOR EFFECT OF DUMMY FILL PATTERNS ON PARASITIC EXTRACTION," which is incorporated herein by reference in its entirety.

BACKGROUND OF THE INVENTION

1. Field of the Invention

The present invention relates generally to electronic circuits, and more particularly but not exclusively to the design and manufacture of integrated circuits.

2. Description of the Background Art

In recent years, integrated circuits have been increasing in complexity and in the degree of integration with each generation. Integrated circuits generally include multiple patterned conducting, semiconducting, and dielectric layers formed on a substrate or wafer by a combination of photolithographic, etching and deposition techniques. The increased complexity of latest generation of devices require finer and more accurately formed wiring and interconnects or vias. Thus, before each successive layer is formed, the underlying surface or present layer is planarized by, for example, chemical-mechanical polishing or planarization (CMP). CMP produces a substantially flat surface across the layer provided the layer has a substantially uniform density in a distribution or spacing of elements or features across the surface.

Figure 1A:
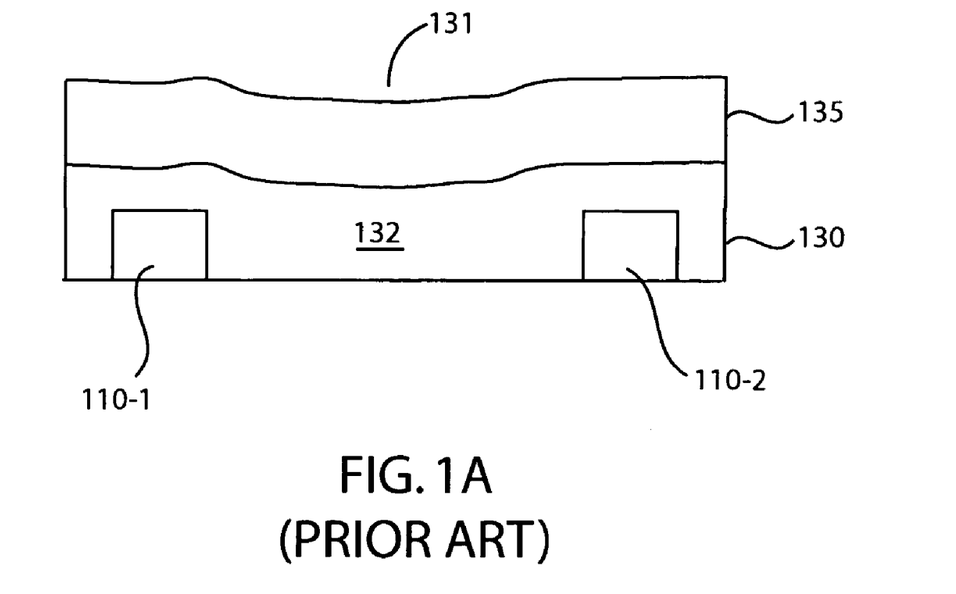
FIGS. 1A and 1B schematically illustrate the use of dummy metal patterns in integrated circuits.

Although CMP can flatten small imperfections relatively well, differences in the size and spacing of various elements in a patterned layer can often yield significant differences in density of the layer, resulting in non-uniform planarization across the surface of the substrate. This problem is illustrated with reference to the schematic cross-sectional views of FIGS. 1A and 1B. In FIG. 1A, an interlevel dielectric (ILD) layer 135 is formed over a metal level 130. Metal level 130 includes patterned metal lines 110 (i.e., 110-1, 110-2) separated by a dielectric 132. Depending on the spacing between metal lines 110, chemical-mechanical polishing of the surface of interlevel dielectric layer 135 may result in an indentation 131 in regions between metal lines 110.

Figure 1B:
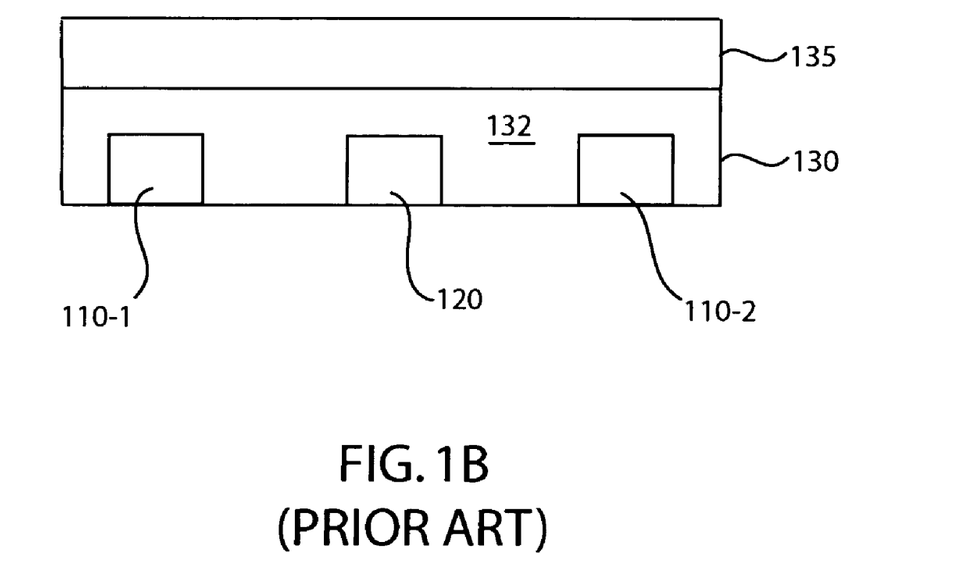

To address the aforementioned planarization problem, designers may incorporate dummy metal patterns in metal levels. The number of dummy metal patterns to be added to a metal level may depend on pattern density requirements. Dummy metal patterns, which are also referred to as "waffles" or "dummy fill patterns," allow the thickness of an interlevel dielectric to remain consistent during CMP. Other than to provide structural support, dummy metal patterns have no electrical function in the integrated circuit. That is, current is not flown through dummy metal patterns. In FIG. 1B, a dummy metal pattern 120 is added between metal lines 110. Dummy metal pattern 120 has no electrical function and is accordingly left electrically floating.

Computer aided design programs may be employed to create a process model that describes the behavior of an integrated circuit. Process models allow designers to simulate the integrated circuit for testing, optimization, and other purposes. In a typical design flow, the dummy metal patterns may be added or drawn to the circuit layout just prior to tape out after the timing closure step is complete. Although there is no current flow through a dummy metal pattern, it may interact with other nets affecting the parasitic capacitance, which impacts circuit timing.

One way to account for the effects of dummy metal patterns is to add them to the circuit layout prior to circuit extraction for timing. However, conventional high capacity parasitic extraction tools, such as the Assura™ and QX™ software from Cadence Design systems and the Caliber™ software from Mentor Graphics, cannot accurately account for floating geometries. The extraction may result in pessimistic capacitance values, which can be up to 15% error in some cases. Adding dummy metal patterns to the circuit layout before extraction may reduce the capacity of the extraction software as well. Furthermore, in a number of cases, simulation/timing analysis tools are not capable of handling capacitors to floating nets, requiring a reduction step to eliminate the floating capacitors. Simply removing floating capacitors may cause the circuit timing results to be incorrect. An alternative solution to this problem may be to decouple capacitors prior to eliminating the floating capacitors. However, In this case, the capability to simulate the effect of coupling noise is lost.

Some pattern density simulation tools, such as the Champgeo™ software from UbiTech, Inc., accept process parameters and a layout to simulate for oxide variation across the die. However, the resulting process model is specific to particular layouts and must be derived every time the layout is changed.

The use of high-density plasma or new polishing techniques in the manufacture of integrated circuits can reduce the metal density requirements for CMP, thus lessening the need for dummy metal patterns in the first place. However, this approach may necessitate relatively expensive process changes. Conventional field solver tools can accurately account for floating parasitic effects due to dummy metal patterns. However, these field solver tools have limited capacity, and are not usually practical for use on large circuits. Manually adding dummy metal patterns or generating them during extraction increases the run time.

SUMMARY

In one embodiment, a level in a process technology for an integrated circuit that has dummy metal patterns is represented as a level in a process model. The level of the process model may comprise a high-k dielectric to represent the dummy metal patterns. In the level of the process model, each metal line may be surrounded by a normal dielectric. If the process technology has voids or pockets of air in between the metal lines, then each void or air pocket may be placed in a normal dielectric in the process model. Among other advantages, this allows the process model to take into account the effects of the dummy metal patterns.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Embodiments of the present invention may be employed in the design and manufacture of integrated circuits that have dummy metal patterns. In one embodiment, an improved process model that takes into account the effects of dummy metal patterns is created. Details of this improved process model are further discussed beginning with FIG. 2. The improved process model is then employed in conjunction with a high capacity or full chip capable parasitic extraction tool to characterize the interconnects of the integrated circuit. Examples of such extraction tools include the Assura™ and QX™ software from Cadence Design systems and the Caliber™ software from Mentor Graphics.

The extraction of parasitic capacitance is a complex problem and accurate extractions involve the use of 3D (three dimensional) field solvers. While accurate, 3D analysis is capacity limited. Even for relatively small 6 to 10 net circuits, extraction may take 10 to 20 hours to complete. High-capacity extraction tools use 3D field solver technology to calculate capacitance for different types of interconnect structures. These predetermined set of interconnect structures and their capacitance values are stored in a library format. This process is also referred to as interconnect characterization for a technology and is performed once per technology. For the Assura™ software, a program called "capgen" performs this task; for the QX™ software, a program called "icecaps" performs this task, etc. The extraction process is reduced to recognition of interconnect structures in the circuit layout that match the predetermined set of interconnect structures in the library. A curve fitting mechanism is then employed to calculate the parasitic capacitance in the circuit layout. This interconnect characterization may be performed using the improved process model or its variants. For example, the improved process model may be used for "capgen" when employing the Assura™ software, for icecap when employing the QX™ software, and so on.

Figure 2:
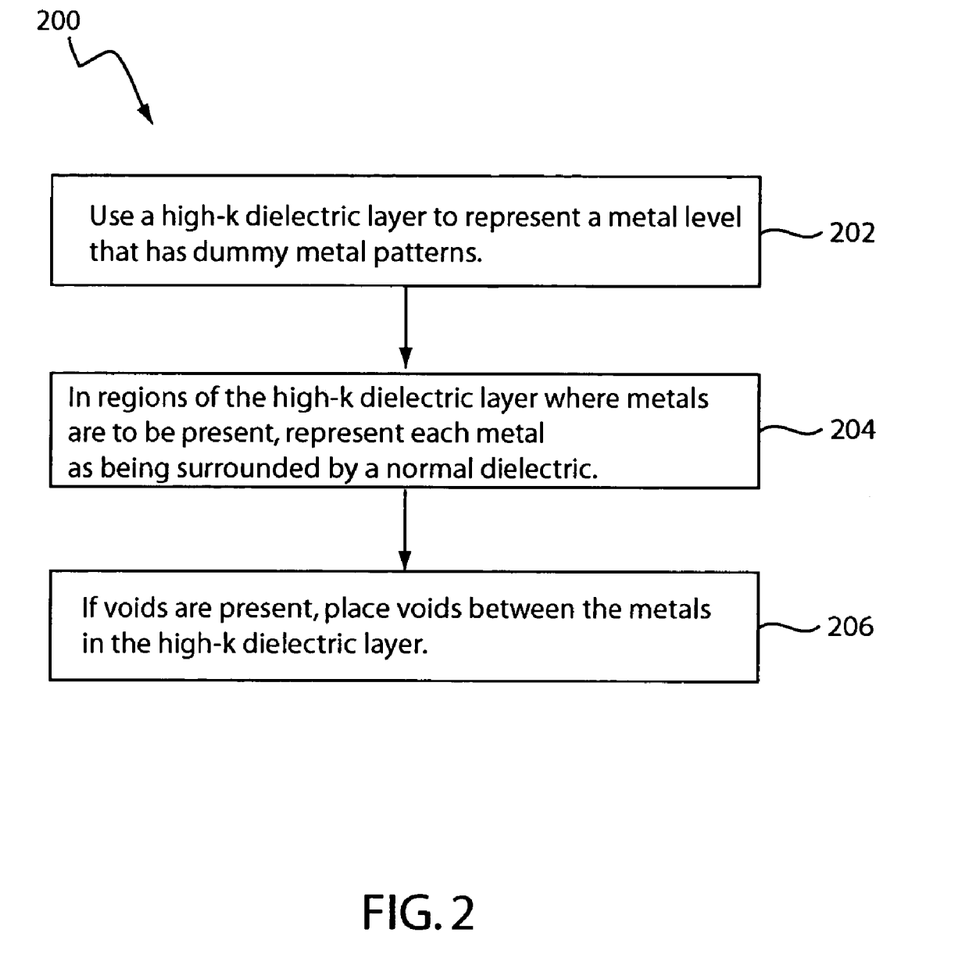
FIG. 2 shows a flow diagram of a method of creating a process model in accordance with an embodiment of the present invention.

FIG. 2 shows a flow diagram of a method 200 of creating a process model in accordance with an embodiment of the present invention. Method 200 will be described with reference to FIGS. 3A, 3B, and 3C, which schematically show levels that take into account the effects of dummy metal patterns in accordance with embodiments of the present invention.

Figure 3A:
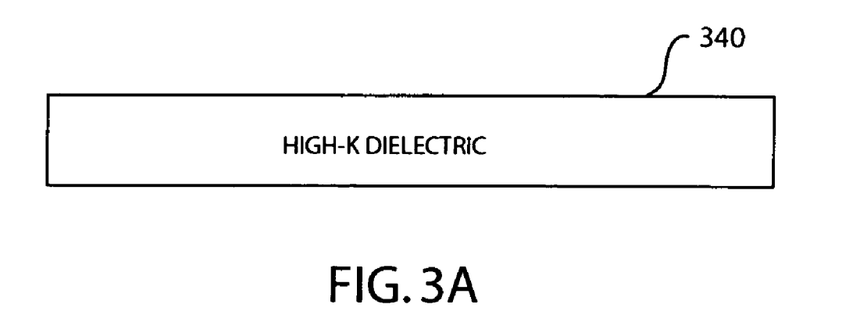
FIGS. 3A, 3B, and 3C schematically show levels of a process model in accordance with an embodiment of the present invention.

In step 202, a level of a process technology for an integrated circuit that has dummy metal patterns is represented in a process model by a high-k dielectric layer. A process technology generally describes an integrated circuit in terms of the process to be used in fabricating the integrated circuit. A high-k dielectric layer may comprise a dielectric material having a dielectric constant equal to or greater than about 15. Silicon dioxide is the most commonly used dielectric material. The relative dielectric constant of silicon dioxide is about 3.0 to 4.0. It is to be noted that some emerging new dielectric materials have a relative dielectric constant less than about 3.0 (low-k). A high-k dielectric constant is any value above 10.0. An example model level with such a high-k dielectric layer is shown in FIG. 3A. In FIG. 3A, high-k dielectric layer 340 is so named because it has a relatively high dielectric constant. The dielectric constant of layer 340 depends on the particulars of the process technology. For example, the dielectric constant of layer 340 may be about 15 or greater. The dielectric constant assigned to layer 340 may be verified and optimized in a verification step, such as step 508 of the later discussed method 500.

Figure 3B:
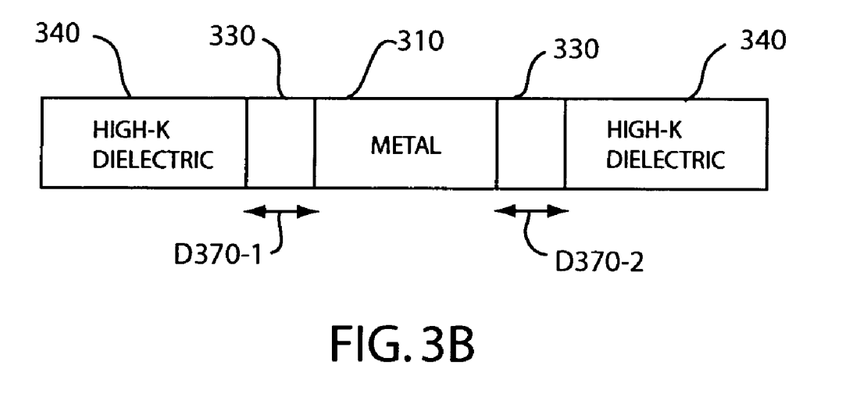

In step 204, in regions of the high-k dielectric layer where metals are to be present, each metal is surrounded by a "normal" dielectric in the process model. The normal dielectric is the dielectric surrounding the metal in the actual integrated circuit. The normal dielectric may be placed between the metals and the high-k dielectric layer. An example model of a metal level in accordance with step 204 is shown in FIG. 3B. In FIG. 3B, a metal 310 may be a patterned metal line in the actual integrated circuit. The metal 310 is also surrounded by a normal dielectric 330, which comprises dielectric material present with the metal 310. Space not occupied by the normal dielectric 330 and the metal 310 remains occupied by the high-k dielectric layer 340. Dimensions D370-1 and D370-2 form the width of a normal dielectric 330 surrounding the metal 310. The width of the normal dielectric 330 in the model may depend on the particulars of the process technology. For example, each dimension D370 (i.e., D370-1 or D370-2) may be about 0.48 microns. As a specific example, metal level 130 shown in FIG. 1B may be modeled as shown in FIG. 3B, with dielectric 132 being represented by normal dielectric 330, a metal 110 being represented by the metal 310, and the rest of the regions in the model level being occupied by the high-k dielectric layer 340.

Figure 3C:
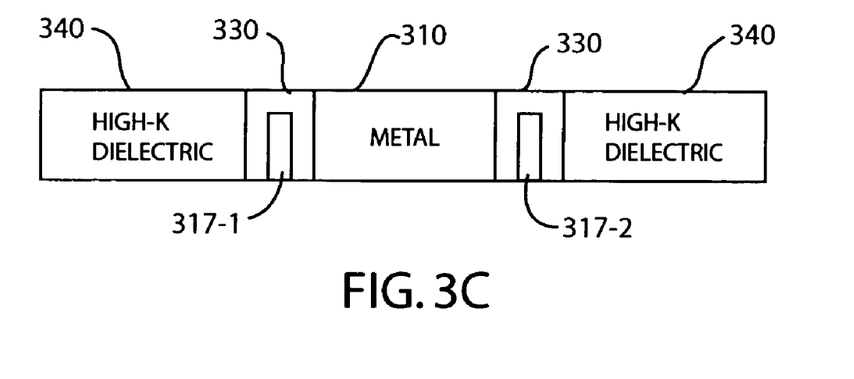

In step 206, if voids are present in the actual integrated circuit, the voids are placed between metals in the process model. In one embodiment, the voids are represented in the model as regions within a normal dielectric. An example model level in accordance with step 206 is shown in FIG. 3C. In the example of FIG. 3C, the voids 317 (i.e., 317-1, 317-2) are placed in the model level within normal dielectric 330.

The process model resulting from method 200 may be implemented using commercially available extraction tools, such as the previously mentioned software from Cadence Designs Systems and Mentor Graphics, for example. The process model advantageously takes into account the effects of dummy metal patterns without appreciably increasing parasitic capacitance extraction time. Method 200 may be employed in the design of both full-custom and "ASIC-like" integrated circuits without appreciably limiting the capacity of existing extraction tools.

Figure 4A:
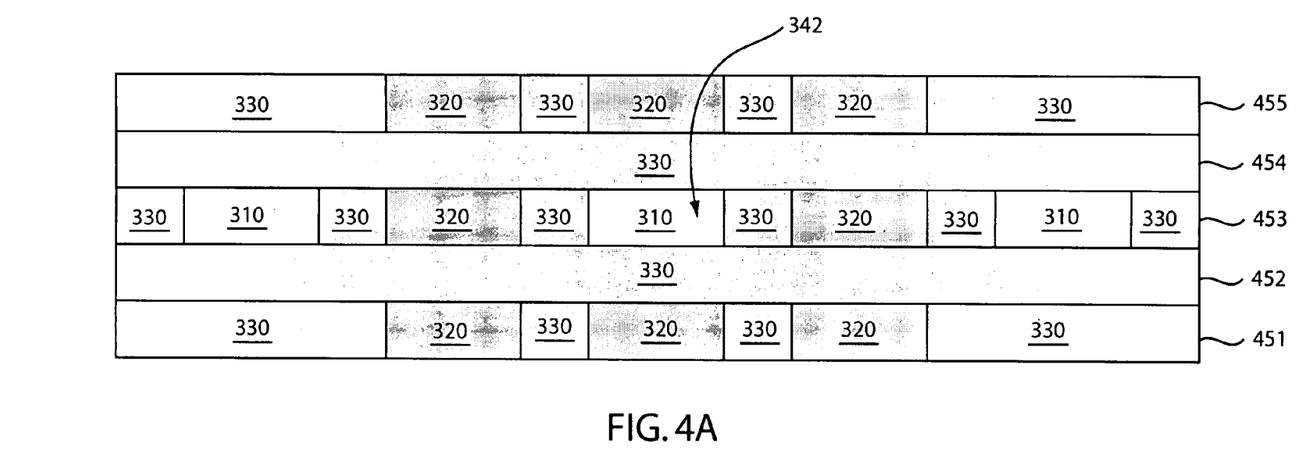
FIG. 4A schematically shows a cross-section of a process technology for an integrated circuit.

Another example illustrating method 200 is now described with reference to FIGS. 4A and 4B. FIG. 4A schematically shows a cross-section of a process technology for an integrated circuit. In FIG. 4A, the integrated circuit includes overlying levels 451-455. Level 451 comprises dummy metal patterns 320 and dielectric 330. Dielectric 330 may comprise any suitable interlevel dielectric (ILD) material, such as silicon dioxide. An interlevel dielectric may have a dielectric constant between about 3.0 to 4.0, for example. Level 452, which comprises a layer of dielectric 330, is over level 451. Level 453 comprises dummy metal patterns 320, metals 310, and dielectric 330. Level 454 is the same as level 452, while level 455 is the same as level 451.

Figure 4B:
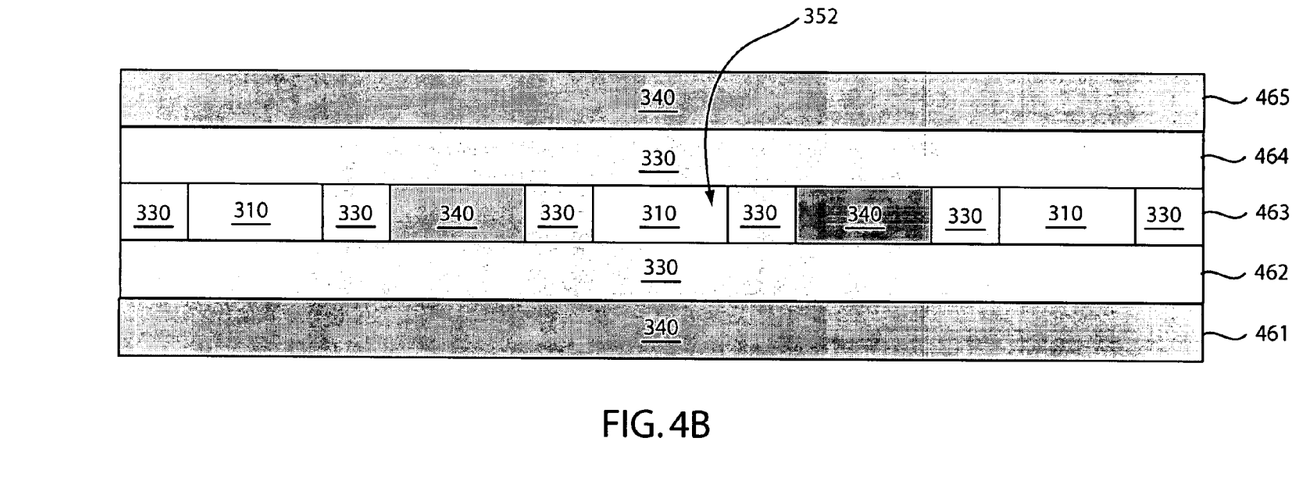
FIG. 4B schematically shows a process model for the process technology of FIG. 4A, in accordance with an embodiment of the present invention.

FIG. 4B schematically shows the new process model for the model of FIG. 4A. The model of FIG. 4B may be generated using method 200, and may be employed for parasitic capacitance extraction. Levels 451-455 of the integrated circuit are represented in the process model by levels 461-465, respectively.

Still referring to FIGS. 4A and 4B, level 451 has dummy metal patterns 320 but does not include any metals. Accordingly, level 451 is represented in the new model by high-k dielectric layer 340 in level 461 (see step 202 of method 200). Level 452 does not include a metal or dummy metal pattern and is thus left the same in level 462 of the new model. Level 453 has metals 310, dielectric 330, and dummy metal patterns 320. Accordingly, in level 463 of the model, metals 310 are surrounded by "normal" dielectric 330, with the rest of level 463 being occupied by high-k dielectric layer 340 (see step 204 of method 200). Levels 454 and 455 are treated in the same way as levels 452 and 451, respectively.

Figure 5:
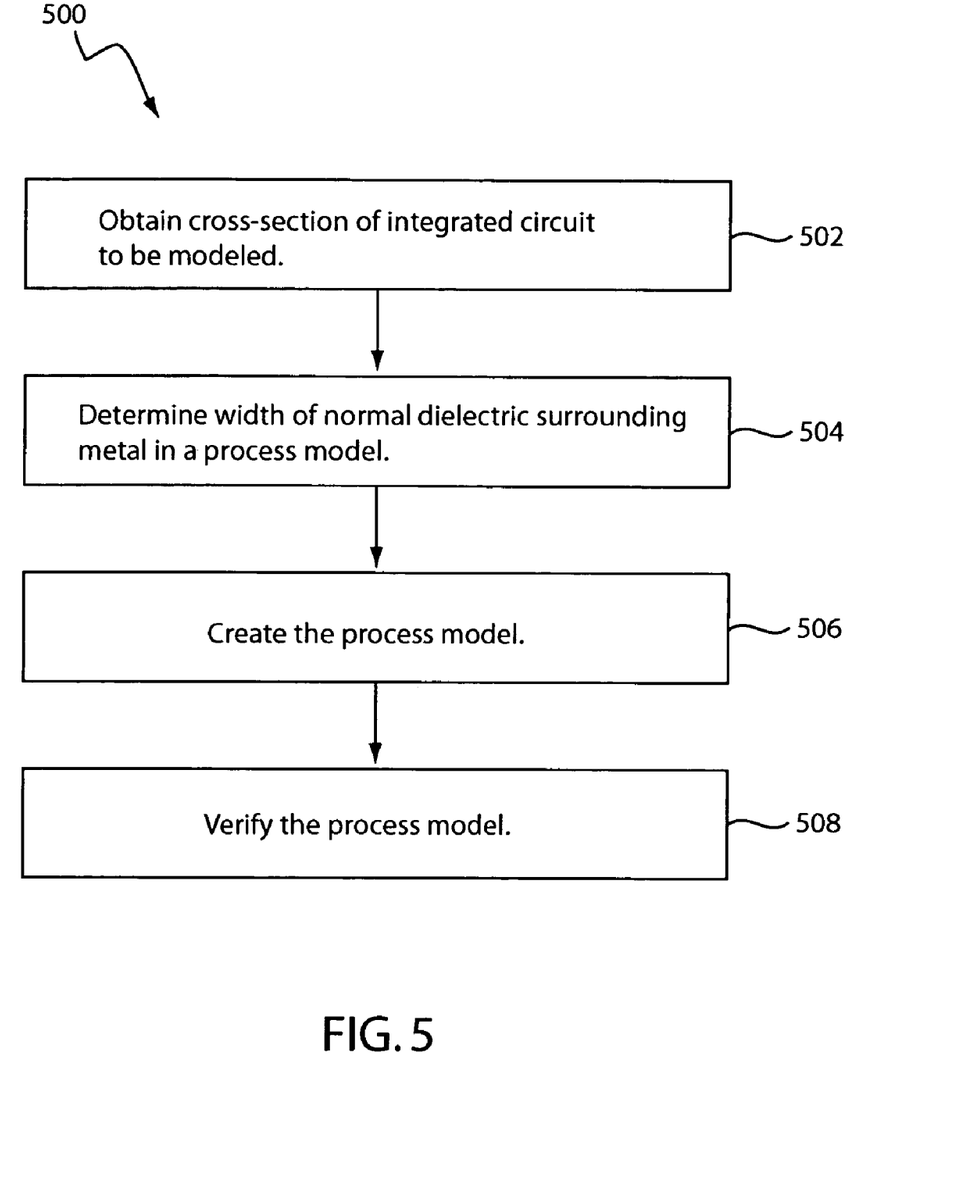
FIG. 5 shows a flow diagram of a method of accounting for the effects of dummy metal patterns in integrated circuits, in accordance with an embodiment of the present invention.

Referring now to FIG. 5, there is shown a flow diagram of a method 500 of accounting for the effects of dummy metal patterns in integrated circuits, in accordance with an embodiment of the present invention. In step 502, the cross-section of the process technology for the integrated circuit to be modeled is obtained. The cross-section of the process technology may be based on electrical design rules, which dictate spacing between multiple levels of interconnect, the thickness of the metal lines, dielectrics, etc.

In step 504, the width of the normal dielectric surrounding each metal in the subsequently created process model is determined. The width of the normal dielectric depends on the particulars of the technology. In one embodiment, the width of the normal dielectric in the model is based on the dimensions and spacing of the dummy metal patterns and the electrical design rules for the process technology. For example, the dimensions and spacing of dummy metal patterns in the integrated circuit may be determined using techniques disclosed in U.S. Provisional Application No. 60/531,938, entitled "WAFFLING TECHNOLOGY BASED ON OXIDE PATTERN DENSITY," filed on Dec. 23, 2003 by Walter Iandolo, Yitzhak Gilboa, and Artur Balasinski, which is incorporated herein by reference in its entirety.

In one embodiment, the width of the normal dielectric may be the larger of (a) twice the minimum allowable spacing between a dummy metal and a metal line or (b) twice the "void critical distance" when voids are present in the metal level. Twice the dimension is used in the embodiment because the width of a normal dielectric comprises two regions surrounding a metal line (e.g., see dimensions D370-1 and D370-2 for the metal 310 in FIG. 3B).

Figure 6A:
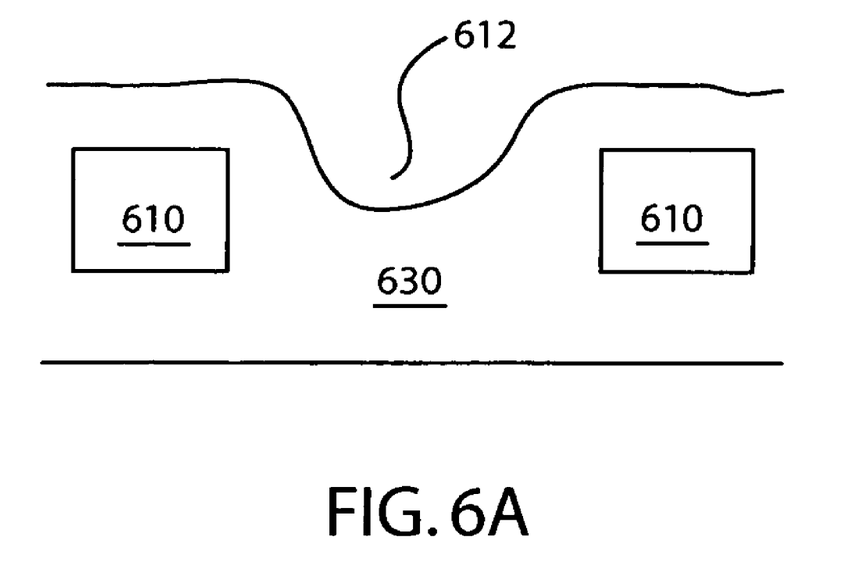
FIGS. 6A and 6B schematically illustrate void critical distance.
Figure 6B:
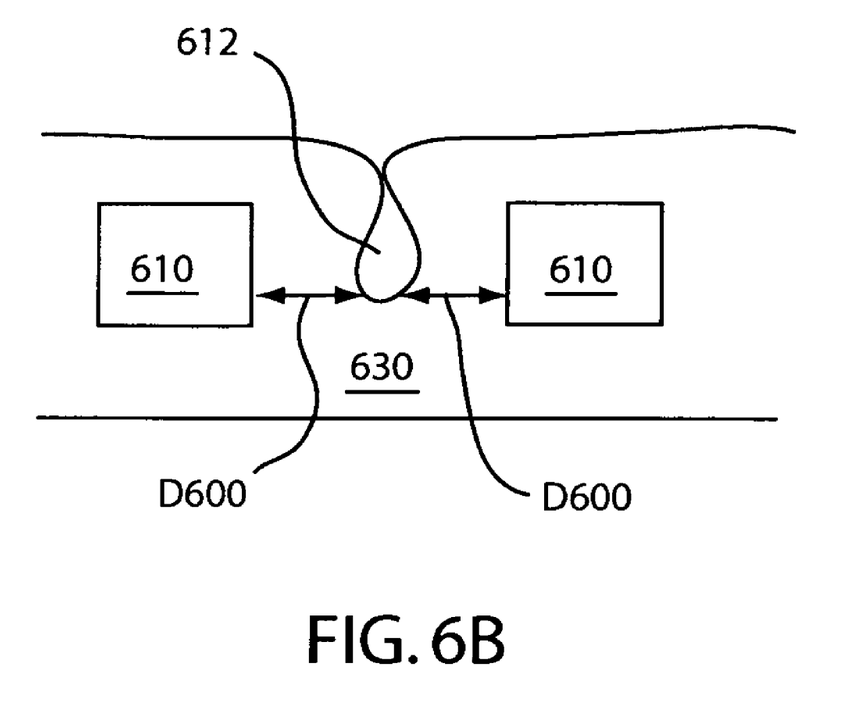

The void critical distance is now explained with reference to FIGS. 6A and 6B, which schematically show cross-sections of a portion of an integrated circuit. In FIGS. 6A and 6B, a dielectric 630 is deposited between metals 610. Dielectric 630 may comprise a material that tends to form voids when deposited between narrowly spaced metal lines. In the example of FIG. 6A, a void 612 begins to form as the spacing between metals 610 is decreased. If the spacing between metals 610 is narrow enough, the void 612 will close as shown in FIG. 6B. The dimension D600 between a metal 610 and the void 612 when the void 612 just closes is referred to as the void critical distance. As mentioned, the void critical distance may be used in determining the width of a normal dielectric in a process model.

Continuing in step 506, the process model is created. The process model may be based on the cross-section of the process technology obtained in step 502 and the width of the normal dielectric determined in step 504. In one embodiment, the process model is created using the method 200 previously discussed with reference to FIG. 2. The resulting process model may be employed in conjunction with a parasitic capacitance extraction tool to characterize the interconnects of the integrated circuit.

In step 508, the process model is verified. In one embodiment, only a small portion of the process model is verified. For example, about 3 to 6 nets of the process model may be verified by simulating a test structure using a field solver tool, such as the Raphael™ software from Synopsys, Inc. In one embodiment, the cross-section of FIG. 4A is employed as a 3-wire test structure. The "3-wires" may be the metals 310 at level 453. The dimensions, spacing, and other parameters of metals 310, dummy metal patterns 320, and dielectric 330 in the test structure may be obtained from the cross-section obtained from step 502. In FIG. 4B, which is the resulting process model for the cross-section of FIG. 4A, the width of normal dielectric 330 in level 463 may be obtained from step 504, while the dielectric constant of high-k dielectric layer 340 may be an expected value based on predictions or previous verification steps. The results of running a simulation using the process model of FIG. 4B may be compared to measured results of electrically testing the cross-section of FIG. 4A. The dielectric constant of high-k dielectric layer 340 and other parameters of the process model may be optimized until the results of the simulation agree with the results of the electrical testing. For example, the dielectric constant of the high-k dielectric layer 340 may be changed until the measured capacitance of the center metal 310 (pointed to by arrow 342 in FIG. 4A) of the test structure and the extracted capacitance of the center metal 310 in the process model (pointed to by arrow 352 in FIG. 4B) agree to within 5%.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of modeling an integrated circuit, the method comprising:

representing metals as a high-k dielectric in a level of a process model;

surrounding the metals with a normal dielectric in the level of the process model, the normal dielectric representing actual dielectric in an integrated circuit modeled by the process model; and using regions within the normal dielectric in the level of the process model to represent a void in the integrated circuit modeled by the process model, a width of the normal dielectric in the process model being based on a critical distance between the void and a metal adjacent to the void in the integrated circuit.

2. The method of claim 1 further comprising:
extracting a capacitance of the level of the process model to generate an extracted capacitance.

3. The method of claim 2 further comprising:
verifying an accuracy of the extracted capacitance.

4. The method of claim 1 wherein the level of the process model represents a level of the integrated circuit that is to be processed by chemical-mechanical planarization.

5. A process model for a process technology of an integrated circuit, the model comprising:
a first level comprising a high-k dielectric for each level of the process technology that contains a metal accounting for a dummy metal pattern, the first level further comprising a plurality of metal lines, each of the metal lines being surrounded by a normal dielectric that is present with the metal lines in an integrated circuit modeled by the process model; and
a void placed within the normal dielectric, wherein a dimension of the normal dielectric in the process model is based on a critical distance between the void and a metal line adjacent to the void in the integrated circuit.

6. The model of claim 5 wherein the high-k dielectric has a dielectric constant greater than or equal to about 10.

7. The model of claim 5 further comprising a second level overlying the first level, the second level comprising an interlevel dielectric.

8. The model of claim 5 further comprising a second level overlying the first level, the second level comprising a second set of metal lines, each metal line in the second level being surrounded by a normal dielectric that is present with the second set of metal lines in the integrated circuit.

9. A method of taking into account effects of dummy metal patterns in an integrated circuit, the method comprising:

obtaining a cross-section of a process technology for the integrated circuit;

determining a dimension of a normal dielectric surrounding a metal in a process model;

creating the process model using information from the cross-section of the process technology and the dimension of the normal dielectric, the process model including a level representing a level of the process technology that has dummy metal patterns, the level of the process model comprising a high-k dielectric, the level of the process model comprising metal lines that represent metal lines in the level of the process technology, each metal line in the level of the process model being surrounded by a normal dielectric; and placing a void in the normal dielectric in the level of the process model to represent a void in the level of the process technology, wherein the dimension of the normal dielectric in the process model is based on a critical distance between the void and a metal adjacent to the void in the process technology.

10. The method of claim 9 further comprising:
verifying an accuracy of the process model.

11. The method of claim 9 wherein verifying the accuracy of the process model comprises:
comparing a capacitance extracted from the level of the process model to a measured capacitance of a level of an integrated circuit fabricated in accordance with the process technology.

12. The method of claim 9 wherein the dimension of the normal dielectric is width.

13. The method of claim 9 further comprising:
extracting a capacitance of the process model.

* * * * *